United States Patent [19]

Tokumo et al.

[11] Patent Number: 4,476,571
[45] Date of Patent: Oct. 9, 1984

[54] AUTOMATIC SOUND VOLUME CONTROL DEVICE

[75] Inventors: Akio Tokumo; Masayuki Kato, both of Saitama, Japan

[73] Assignee: Pioneer Electronic Corporation, Saitama, Japan

[21] Appl. No.: 387,895

[22] Filed: Jun. 14, 1982

[30] Foreign Application Priority Data

Jun. 15, 1981 [JP] Japan .................................. 56-92893
Jun. 15, 1981 [JP] Japan .................................. 56-92894
Jun. 15, 1981 [JP] Japan .................................. 56-93307

[51] Int. Cl.³ .............................................. H04B 1/16
[52] U.S. Cl. ...................................... 381/57; 381/107
[58] Field of Search ............... 455/234, 238; 381/106, 381/107, 108, 86, 57

[56] References Cited

U.S. PATENT DOCUMENTS

| | | | |
|---|---|---|---|
| 2,501,327 | 3/1950 | Good | 381/57 |
| 3,497,622 | 2/1970 | Markin et al. | 179/1 VL |
| 3,934,084 | 1/1976 | Munson et al. | 179/1 VL |
| 4,247,955 | 1/1981 | Weidmann | 179/1 VL X |

*Primary Examiner*—Gene Z. Rubinson
*Assistant Examiner*—James L. Dwyer
*Attorney, Agent, or Firm*—Sughrue, Mion, Zinn, Macpeak, and Seas

[57] ABSTRACT

An automatic volume control device for a car stereo or the like which adjusts the volume according to an environmental noise level includes a microphone and a low pass filter circuit whose characteristic is designed so as to correspond to the human auditory characteristic at a low frequency end, but so as to cut out higher frequency components such as voices, etc. A time constant circuit serves to smooth volume transients in case the environmental noise sharply increases.

14 Claims, 9 Drawing Figures

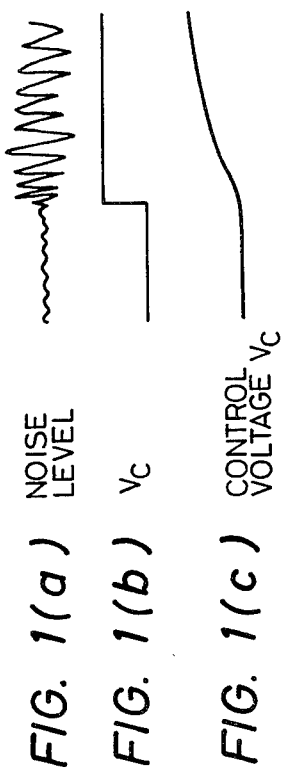
FIG. 1(a) NOISE LEVEL
FIG. 1(b) $V_C$
FIG. 1(c) CONTROL VOLTAGE $V_C$
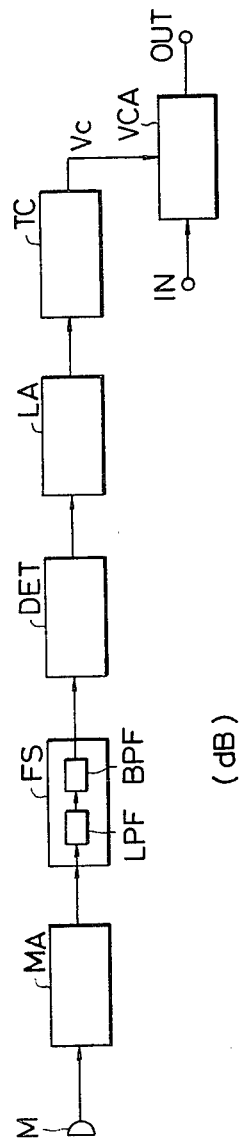
FIG. 2
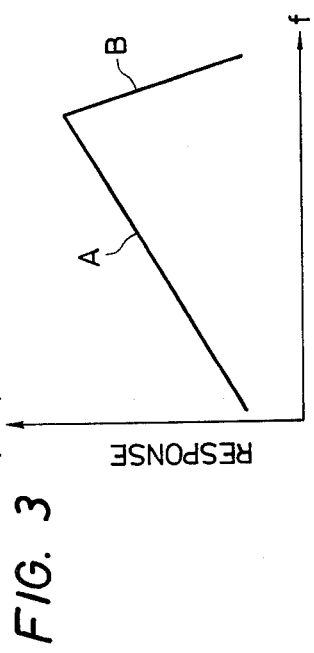
FIG. 3

AUTOMATIC SOUND VOLUME CONTROL DEVICE

BACKGROUND OF THE INVENTION

This invention relates to an automatic sound volume control device for automatically controlling the sound volume generated according to environmental noise, and more particularly to an automatic sound volume control device which prevents the occurrence of an unpleasant feeling due to an abrupt change of a sound volume, and controls the generated sound volume in agreement with the human auditory sense characteristic and without being affected by the generated sound or human voices.

An automatic sound volume control device operates to increase the sound volume in proportion to environmental noise, so that a person can hear sounds from a stereo or radio satisfactorily at all times no matter how large the external noise. For instance in the case of an automobile, the noise level inside changes greatly depending on the running conditions and the running speed, which makes it difficult for the person in the cab of the auto to hear sounds from the car stereo or radio set. This difficulty can be overcome by controlling the sound volume according to the environmental noise.

In a conventional automatic sound volume control device for this purpose, the noise in the cab (hereinafter referred to as "cab noise") is detected with a microphone, so that the sound volume is controlled with an average noise level signal obtained from the cab noise thus detected.

However, the above-described conventional automatic sound volume control device is disadvantageous in the following point: As the sound volume control is carried out using the average level signal of the cab noise, if the noise level changes abruptly, the sound volume control is effected abruptly, giving an unpleasant feeling to the user. For instance, it is assumed that the noise level increases A times at the time instant $t_1$ as shown in FIG. 1(a), and at the same time, the noise voltage jumps to $AN(v)$ from $N(v)$. In order to obtain the average level, a sound volume controlling control voltage $V_c$ is obtained from a circuit having a time constant $(\tau)$. In this case, the control voltage $V_c$ is:

$$V_c = N + (AN - N)(1 - e^{-t/\tau}) \quad (1)$$

Thus, the control voltage $V_c$ changes abruptly at the time instant $t_1$ as indicated in FIG. 1(b). If, in this case, a voltage-controlled amplifier section for carrying out sound volume control with the control voltage $V_c$ has a characteristic of $K/v$, then the gain G of the voltage-controlled amplifier section is:

$$G = KN + K(AN - N)(1 - e^{-t/\tau})$$
$$= 20 \log K + 20 \log N + 20 \log 1 + \{(A - 1)(1 - e^{-t/\tau})\}$$

A time variable is included in the logarithmic term. Therefore, in association with the characteristic of the term $(1 - e^{-t/\tau})$ the sound volume changes abruptly and unpleasantly.

In the case of the above-described conventional automatic sound volume control device, the sound volume control is carried out merely by detecting the cab noise. Therefore the device is disadvantageous in that positive feedback occurs, and the control is unstable because even a voice is detected as noise.

In addition, the conventional automatic sound volume control device involves various other problems such that, for instance, the noise level at which the sound volume control is started and the rate of sound volume control with respect to noise are fixed.

SUMMARY OF THE INVENTION

Accordingly, an object of this invention is to provide an automatic sound volume control device in which, even when the environmental noise changes abruptly, the operation is stable and in agreement with the human auditory sense characteristic so as to avoid giving one an unpleasant feeling, and wherein the operating noise level and the amount of sound volume control can be readily changed.

The foregoing object and other objects as well as the characteristic features of the invention will become more apparent from the following detailed description when read in conjunction with the accompanying drawings, in which like parts are designated by like reference numerals or characters.

BRIEF DESCRIPTION OF THE DRAWINGS

In the accompanying drawings:

FIGS. 1(a) through 1(c) are waveform diagrams indicating the relation between the variation of an environmental noise and a control signal;

FIG. 2 is a block diagram showing one example of an automatic sound volume control device according to this invention;

FIG. 3 is a graphical representation indicating the characteristic of a filter section of FIG. 2;

DETAILED DESCRIPTION OF THE PREFERRED EMBODIMENTS

Figure 4A:
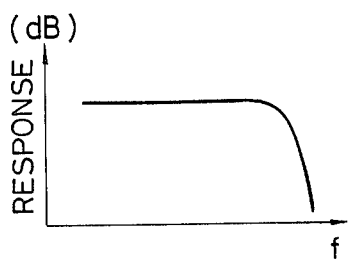
FIGS. 4(a) through 4(b) are graphical representation showing the characteristics of a low-pass filter and a bandpass filter which form the filter section.

An automatic sound volume control device according to this invention will now be described with reference to the accompanying drawings.

FIG. 2 is a block diagram showing one example of the automatic sound volume control device of the invention. A noise signal detected by a microphone M is amplified to a value suitable for after-treatment by a microphone amplifier MA, and is then applied to a filter section FS. In this case, in the filter section FS the cab noise is represented by low and very low frequency components in order to reduce the positive feedback of the cab signal and to reduce the effect of voices. Studies on cab noises have revealed that the larger part of vehicle running noise is comprised of low and very low frequency components of several tens of hertz or less. However, if volume control is carried out using a noise signal which is represented by the low frequency component only, the volume control cannot match the noise level in the human auditory sense, because the auditory sense of a person is lowered in the very low frequency range. Accordingly, in the device of the invention, the characteristic of the filter section FS is such that, as shown in FIG. 3, the low cut characteristic A is moderate in gradient, thus matching the human hearing sense, and the high cut characteristic B is steep, thus preventing the effects of the sound signal and of the voice. In order to provide such a characteristic for the filter section FS, the latter FS is made up of a low-pass filter LPF having a characteristic such as indicated at A in FIG. 3, and a band-pass filter BPF having a characteristic as indicated at B in FIG. 3.

Further in FIG. 2, reference character DET designates a noise level detecting section for converting a noise signal outputted by the filter section FS into a corresponding voltage value; LA, a logarithmic amplifier section for subjecting the output of the noise level detecting section DET to logarithmic amplification; TC, a time constant circuit which operates to prevent an abrupt change in the output of the logarithmic amplifier section LA; and VCA, a voltage-controlled amplifier section which varies its amplification level according to the output signal of the time constant circuit TC. The noise level detecting section DET can be arranged so that only a noise signal above a reference value is output. In the voltage-controlled amplifier VCA, a sound or music signal applied to the input terminal IN thereof is amplified according to the voltage value of an output signal from the time constant circuit TC, and is then applied to the output terminal OUT.

Figure 4B:
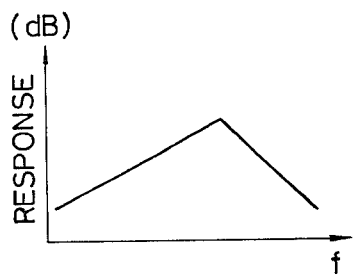

When the amount of cab noise is increased, the output of the microphone M in the automatic sound volume control device is increased. The output of the microphone M, after being amplified to a predetermined value by the microphone amplifier section MA, is supplied to the filter section FS. The filter section FS is made up of the low-pass filter LPF and the band-pass filter BPF, as described above. The low-pass filter LPF transmits only the low and very low frequency components of several tens of Hertz as indicated in FIG. 4(a). The frequency components pass through the band-pass filter BPF, and thus, the characteristics shown in FIGS. 4(a) and 4(b) are combined together, as a result of which the characteristic of the filter section FS is as indicated in FIG. 3. In the characteristic shown in FIG. 3, the low frequency side has a low cut characteristic A corresponding to the human auditory sense, while the high frequency side has the high cut characteristic B to prevent any effect due to the sound signal. This results in a filter section having a differentiation characteristic of a degree corresponding to the human auditory sense in the low frequency range, and a steep gradient for eliminating high frequency components in the high frequency range. In the frequencies in the frequency spectrum of the cab noise are uniformly increased, then the aforementioned differentiation characteristic may not be needed. However, when a peak frequency occurs because of the resonance of the vehicle body, for instance, as the peak frequency is decreased, an error is liable to take place between the detection voltage of the microphone and the sound pressure in the auditory sense.

In practice, with respect to cab noise, resonance often takes place in the low frequency range, and the resonance frequency varies intricately. Accordingly, if, in the case where the cab noise is represented by a signal in the low frequency range which is not affected by the sound signal or the voice, the filter section FS is allowed to have a differentiation characteristic corresponding to the human auditory sense characteristic for the low frequency side, whereby the error between the detection voltage and the sound pressure in the human auditory sense can be eliminated.

The output of the filter section as just described is converted into a voltage value by the noise level detecting section DET. The voltage value, after being subjected to logarithmic compression by the logarithmic amplifier LA, is applied, as a control voltage Vc, to the voltage-controlled amplifier section VCA through the time constant circuit TC, which is adapted to "absorb" abrupt changes. In the voltage-controlled amplifier section VCA, the gain thereof is varied with the control voltage Vc so that the sound signal supplied to the input terminal IN is delivered to the output terminal OUT with its level changed; that is, the sound signal is varied according to the control voltage Vc, i.e., the cab noise level. Accordingly, when the cab noise is increased, the level of the sound signal is increased. Therefore, the sound signal can be heard at a constant rate at all times.

If the microphone amplifier section has a gain $\alpha$, the output of the noise level detecting section DET is represented by N(v) in the case of $\alpha=1$, the logarithmic amplifier section LA has a gain $\beta$, and the voltage-controlled amplifier section VCA has a characteristic K(dB/V); then the control voltage Vc can be represented by the following expression (1):

$$Vc = \beta \log \alpha N \qquad (1)$$

Upon application of the control voltage Vc, the gain G of the voltage-controlled amplifier section VCA is:

$$G = K \times Vc = K \beta \log \alpha N \qquad (2)$$

Figure 5:
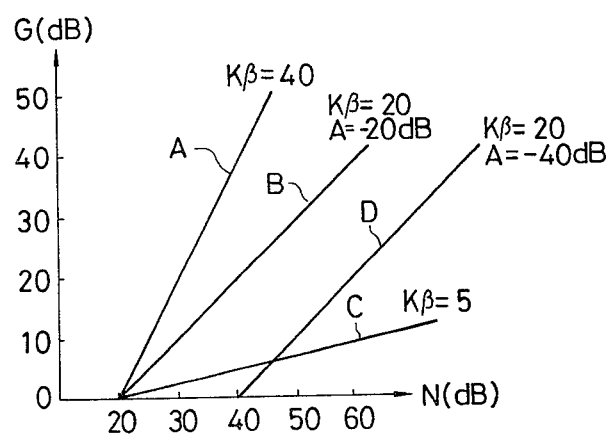
FIG. 5 is a graphical representation indicating characteristics of the circuit of FIG. 2.

When the gain N of the noise level detecting section DET is increased by 20 dB, the sound signal is increased by K $\beta$ dB. The relations between the gains N and G are as indicated in FIG. 5. If, with the gain of the voltage-controlled amplifier section VCA fixed, the gain B is changed, then the degree of gradient is increased as the gain B is increased as indicated by the straight lines A, B and C in FIG. 5. On the other hand, the rate of the increase of the sound signal to the increase of the noise signal is changed as the degree of gradient is increased. If, on the other hand, the gain is changed with the gain K $\beta$ fixed, a reference noise level, i.e., the noise level for starting the automatic sound volume control, is changed, as indicated by the straight lines B and D in FIG. 5.

In this case, the control signal Vc supplied from the time constant circuit TC to the voltage controlled amplifier section VCA, being subjected to logarithmic compression, is:

$$Vc = 20 \log N + (20 \log AN - 20 \log N) \times (1 - e^{-t/\tau})$$
$$= 20 \log N + (1 - e^{-t/\tau})(20 \log A)$$

Therefore, if the control characteristic of the voltage-controlled amplifier section VCA is represented by K dB/Vc, then the gain G of the amplifier section VCA is:

$$G = K 20 \log N + K(1 - e^{-t/\tau}) 20 \log A$$

It should be noted that no time variable is included in the logarithmic terms in the above-described expression for the gain G, and therefore the sound volume variation is constant in the auditory sense irrespective of the amplification factor A of the environmental noise. In other words, even if the environmental noise is increased abruptly at the time instant $t_1$ as shown in FIG.

1(a), with the aid of the operation of the time constant circuit TC, the control signal Vc exhibits a moderate change as indicated in FIG. 1(c), thus providing an excellent sound volume control characteristic which is not unpleasant. If, in this connection, an integrator is employed for the time constant circuit TC, then the sound volume can be increased at a predetermined rate with respect to time.

Figure 6:
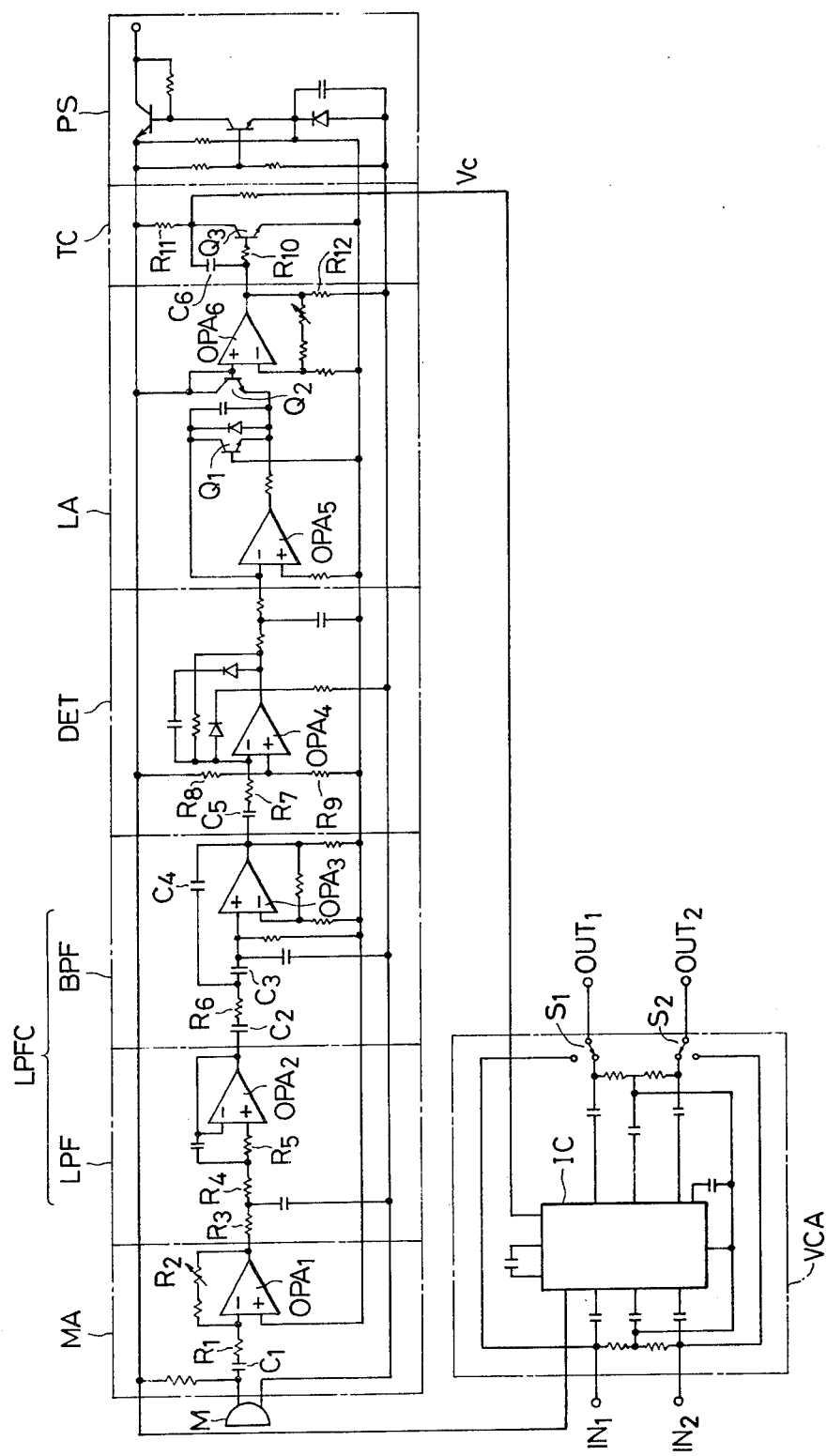
FIG. 6 is a circuit diagram showing the automatic sound volume control device of FIG. 2 in more detail.

FIG. 6 is a circuit diagram showing one example of the automatic sound volume control device in FIG. 2.

The output of the microphone M is applied through a capacitor $C_1$ and resistor $R_1$ to the inversion input terminal of an operation amplifier $OPA_1$ forming the microphone amplifier section MA, where it is amplified. In this operation, the gain $\alpha$ ($VR_2/R_1$) of the microphone amplifier section MA can be changed by changing the resistance of a feedback resistor $R_2$. The output of the operational amplifier $OPA_1$ is supplied through resistors $R_3$, $R_4$ and $R_5$ to an operational amplifier $OPA_2$ which forms the low-pass filter LPF adapted to cut off voices and car stereophonic sounds. The output of the low-pass filter LPF is supplied through capacitors $C_2$ and $C_3$ and a resistor $R_6$ to the non-inversion input terminal of an operational amplifier $OPA_3$ forming the band-pass filter BPF, and the output of the operational amplifier $OPA_3$ is fed back through a capacitor $C_4$. The noise level detecting section DET has an operational amplifier $OPA_4$, to the inversion input terminal of which the output of the band-pass filter BPF is applied through a capacitor $C_5$ and a resistor $R_7$. A reference voltage obtained by the voltage division of resistors $R_8$ and $R_9$ is applied to the non-inversion input terminal of the operational amplifier $OPA_4$. In the noise level detecting section DET, the input, after being converted into a DC voltage, is subjected to detection in a wide dynamic range, and when a voltage signal higher than the reference value is inputted, the corresponding noise level detection signal is outputted. The output signal of the noise level detecting section DET is applied to the logarithmic amplifier section LA comprising operational amplifiers $OPA_5$ and $OPA_6$. A transistor $Q_1$ is inserted in the feedback path of the operational amplifier $OPA_5$, so that the input signal is subjected to logarithmic compression and is then supplied to the time constant circuit TC.

In this case, with the operational aplifier $OPA_5$ only, as the amplitude of the output signal is small, the reference input level becomes small. In order to overcome this difficulty, a transistor $Q_2$ is connected to the input of the operational amplifier $OPA_6$, to thereby increase the level. In the abovedescribed microphone amplifier section MA, the gain is variable; however, sound volume can be corrected with respect to the same noise level variation by varying the gain in the amplification stage after the logarithmic variation. For this purpose, a feed-back resistor $R_{12}$ is provided for the operational amplifier $OPA_6$.

In the time constant circuit TC, an inverting transistor $Q_3$ having a gain of one receives the output of the logarithmic amplifier section LA as a base input through a resistor $R_{10}$, and a capacitor $C_6$ and a collector resistor $R_{11}$ which are connected between the collector and base of the transistor $Q_3$ form a mirror integration circuit.

The voltage-controlled amplifier section VCA is made up of an integrated circuit block IC. In the section VCA, the gain is changed according to the control signal from the time constant circuit TC, so as to change the level of the sound signal applied across the input terminals $IN_1$ and $IN_2$ according to the noise level, and the signal thus treated is supplied to the output terminals $OUT_1$ and $OUT_2$ to change the generated sound volume. In FIG. 6, reference characters $S_1$ and $S_2$ designate manual cut-out switches for directly supplying the sound signal supplied to the input terminals $IN_1$ and $IN_2$ to the output; and PS, a power source section.

As is apparent from the above description, in the automatic sound volume control device according to the invention, the noise level detection signal obtained by detecting environmental noise is subjected to logarithmic compression and is then applied to the time constant circuit, to provide a control signal, and the control signal thus provided is used to control the sound volume controlling voltage-controlled amplifier section. Therefore, abrupt changes in the sound volume due to an abrupt change in the noise level can be prevented. Thus, the device according to the invention has an excellent effect in that the sound volume can be corrected without unpleasant sharp volume transients.

The device of the invention is designed so that it is not affected by the sound generated by voices, by allowing a noise signal obtained through the low-pass filter to represent the low frequency signal and the environmental noise. Furthermore, the low-pass filter is designed so that it has a differentiation characteristic of a degree corresponding to the human auditory sense as its low frequency characteristic, while the high frequency characteristic has a steep gradiation, whereby the error between the detection noise signal and the sound pressure in the human auditory sense is eliminated. This is another excellent effect of the invention.

In the automatic sound volume control device according to the invention, the noise signal is represented by a low frequency signal which is not affected by the sound signal or the voice, and therefore the sound volume can be stably controlled. Furthermore, the device of the invention is advantageous in that the amount of control of the sound volume with respect to noise, and the reference level at which the automatic sound volume control is started can be readily changed.

What is claimed is:

1. In an automatic sound volume control device wherein environmental noise is detected as a noise level signal with a microphone (M) and a detecting circuit (DET), said noise level signal controls the gain of a sound amplifier (VCA) that amplifies a sound input signal into a sound output signal, the improvement comprising:

a logarithmic amplifier section (LA) for logarithmically compressing said noise level signal;

a time constant circuit (TC) receiving an output of said logarithmic amplifier section as an input thereof, the gain of the sound amplifier being controlled according to an output of said time constant circuit; and means for adjusting the gain of said logarithmic amplifier section for obtaining a non-linear relationship between said noise level signal and said sound output signal.

2. In an automatic sound volume control device wherein environmental noise is detected as a noise level signal with a microphone and a detecting circuit, said noise level signal controls the gain of a sound amplifier that amplifies a sound input signal into a sound output signal, the improvement comprising:

low-pass filter circuit means (FS) disposed between said microphone and said detecting circuit, a low frequency side of the characteristic of said lowpass filter circuit means having a differentiation characteristic corresponding to the human auditory sense characteristic, and a high frequency side thereof having a steep gradient characteristic, whereby said detecting circuit converts the frequency components included in an output of said low-pass filter circuit means into an automatic sound volume control signal.

3. An automatic sound volume control device, comprising:
a microphone amplifier section for amplifying an output of a microphone;
a low-pass filter section receiving an output of said microphone amplifier section as an input thereof;
a noise level detecting section for converting an output of said low-pass filter into a corresponding voltage value;
a logarithmic amplifier section for subjecting an output of said noise level detecting section to logarithmic compression;
a voltage-controlled amplifier section for controlling an output level of a sound signal according to an output of said logarithmic amplifier section; and
means for adjusting the output of said logarithmic amplifier section for obtaining a non-linear relationship between the output of said microphone and said output level of sound signal.

4. A device as claimed in claim 1, further including low pass filter circuit means disposed between said microphone and said detecting circuit for removing higher frequency components included in an output of said microphone.

5. A device as claimed in claim 4, further including a microphone amplifier arranged between said microphone and the input of said low pass filter circuit means.

6. A device as claimed in claims 4 or 5, said low pass filter circuit means including a low pass filter having a low frequency characteristic corresponding to the human auditory characteristic, and a band pass filter having a sharp cut off characteristic in a frequency range below that of common human voice frequencies.

7. A device as claimed in claim 1, said time constant circuit operating to smooth abrupt changes in a signal output from said logarithmic amplifier, so as to smoothen a noise level response characteristic of the device.

8. A device as claimed in claim 1, including noise level detecting means connected to said logarithmic amplifier, for outputting said noise level detection signal when an input thereto is greater than a reference value.

9. A device as claimed in claim 2, wherein the sound amplifier is a voltage controlled amplifier and further comprising a time constant circuit, the output of which controls the gain of said voltage controlled amplifier.

10. A device as claimed in claim 2, further including a microphone amplifier arranged between said microphone and the input of said low pass filter circuit means.

11. A device as claimed in claim 2, said low pass filter circuit means including a low pass filter, and a band pass filter having said steep gradient characteristic.

12. A device as claimed in claim 2, wherein said detecting circuit receives an output of said low-pass filter circuit means, and further comprising a logarithmic amplifier (LA) coupled to said detecting circuit, and a time constant circuit (TC) coupled to said logarithmic amplifier.

13. A device as claimed in claim 12, said time constant circuit operating to smooth abrupt changes in a signal output from said logarithmic amplifier, so as to smoothen a noise level response characteristic of the device.

14. A device as claimed in claim 3, further including a time constant circuit operating to smooth abrupt changes in a signal output from said logarithmic amplifier, so as to smoothen a noise level response characteristic of the device.

* * * * *